(12) United States Patent
Shao et al.

(10) Patent No.: US 12,002,911 B2
(45) Date of Patent: Jun. 4, 2024

(54) PASSIVE THREE-DIMENSIONAL LED DISPLAY AND METHOD FOR FABRICATION THEREOF

(71) Applicant: SCT LTD., Grand Cayman (KY)

(72) Inventors: Shihfeng Shao, Milpitas, CA (US); Chang Hung Pan, Milpitas, CA (US)

(73) Assignee: SCT LTD., Grand Cayman (KY)

( * ) Notice: Subject to any disclaimer, the term of this patent is extended or adjusted under 35 U.S.C. 154(b) by 0 days.

(21) Appl. No.: 18/159,203

(22) Filed: Jan. 25, 2023

(65) Prior Publication Data

US 2023/0163263 A1    May 25, 2023

Related U.S. Application Data

(62) Division of application No. 16/951,677, filed on Nov. 18, 2020, now Pat. No. 11,600,753.

(51) Int. Cl.
| | |
|---|---|
| H01L 33/58 | (2010.01) |
| G02B 5/30 | (2006.01) |
| H01L 25/075 | (2006.01) |
| H01L 33/62 | (2010.01) |

(52) U.S. Cl.
CPC ............ *H01L 33/58* (2013.01); *G02B 5/3025* (2013.01); *H01L 25/0753* (2013.01); *H01L 33/62* (2013.01); *H01L 2933/0058* (2013.01); *H01L 2933/0066* (2013.01)

(58) Field of Classification Search
CPC ..... H01L 33/58; H01L 25/0753; H01L 33/62; H01L 2933/0058; H01L 2933/0066; H01L 33/48; H01L 2933/0033; G09F 9/33; G02B 5/3025
See application file for complete search history.

(56) References Cited

U.S. PATENT DOCUMENTS

| | | | |
|---|---|---|---|
| 8,542,270 B2 | 9/2013 | Nelson | |
| 2010/0283885 A1* | 11/2010 | Lin | G02B 5/3025 |
| | | | 348/340 |
| 2017/0263178 A1* | 9/2017 | Bae | G09G 3/32 |
| 2019/0115507 A1* | 4/2019 | Kim | H10K 50/82 |
| 2021/0095193 A1* | 4/2021 | Hyung | C09K 11/883 |
| 2021/0104647 A1* | 4/2021 | Harrold | H01L 25/0753 |
| 2021/0405255 A1* | 12/2021 | Kress | H01L 25/0753 |
| 2022/0011610 A1* | 1/2022 | Akkaya | G02F 1/1336 |
| 2023/0299246 A1* | 9/2023 | Harrold | H01L 33/62 |
| | | | 257/98 |

FOREIGN PATENT DOCUMENTS

| | | | | |
|---|---|---|---|---|
| CN | 102213838 | * | 10/2011 | ........ 27/26 |
| CN | 102213838 A | | 10/2011 | |

\* cited by examiner

*Primary Examiner* — Victor A Mandala
(74) *Attorney, Agent, or Firm* — NKL Law; Allen Xue

(57) ABSTRACT

A 3D LED display panel that includes a substrate and an array light emitting devices mounted on the substrate. The array of light emitting devices includes a plurality of first light emitting devices and a plurality of second light emitting devices. Each first light emitting device has an LED chip/package electrically connected to the substrate and a piece of first circular polarizer attached to the LED chip/package. Likewise, each second light emitting device includes an LED chip/package electrically connected to the substrate and a piece of second circular polarizer attached to the LED chip/package. The first circular polarizer the second circular polarizer have opposite circular polarizations.

7 Claims, 5 Drawing Sheets

PASSIVE THREE-DIMENSIONAL LED DISPLAY AND METHOD FOR FABRICATION THEREOF

CROSS-REFERENCE TO RELATED APPLICATION

This application is a division of U.S. utility patent application Ser. No. 16/951,677, filed Nov. 18, 2020, the content of which is incorporated herein by reference in its entirety.

BACKGROUND

1. Field of Technology

This disclosure relates to the field of 3D display apparatus, especially to passive 3D LED displays and methods for fabrication thereof.

2. Description of Related Art

A passive three-dimensional (3D) display may employ two circular polarizers to transform an unpolarized image into two circularly polarized images. A circular polarizer includes a linear polarizer (e.g., a film or a plate) and a quarter-wave plate (QWP) adhered together. One of the two circular polarizers used for the 3D display has a left circular polarization, which employs a λ/4 QWP having a retardation axis of −45° against the absorbing axis of the linear polarizer. The other circular polarizer employs a λ/4 QWP having a retardation axis of +45° against the absorbing axis of the linear polarizer, which exhibits a right circular polarization. The incident, unpolarized light passes the linear polarizer and becomes linearly polarized light, which passes through QWP and becomes either right-circularly or left-circularly polarized light.

The viewer wears a pair of two opposite polarizing filters. The right-handed circularly polarized image passes the first polarizing filter and is received by one of the viewer's eyes while the left-handed circularly polarized image passes through the second polarizing filter and is received by the other eye. The viewer's brain combines the first and the second polarized images to give the perception of depth, hence generating the 3D effect.

The state-of-the-art technology for 3D LED displays applies a film-type patterned retarder (FPR) on the surface of the display panel, creating two opposite circularly polarized images. However, the process to make the FPR film is complex and expensive, requiring the photo-alignment step using photomask or patterned nano-wire polarizer, which limits the application of FPR in 3D display. In addition, the FPR film is fabricated in rolls so that it may not suitable for small volume productions. Further, 3D LED display is subject to light crosstalk, which restricts the viewing angle, especially in the vertical direction.

Accordingly, there is a need for new devices and methods for passive 3D LED display that reduce cost, provide flexibility in applications, and reduce crosstalk.

SUMMARY

This summary is provided to introduce a selection of concepts in a simplified form that are further described below in the Detailed Description. This summary is not intended to identify key features or essential features of the claimed subject matter, nor is it intended to be used as an aid in determining the scope of the claimed subject matter.

The disclosure provides an LED display panel that includes a substrate and an array light emitting devices mounted on the substrate. The array of light emitting devices includes a plurality of first light emitting devices and a plurality of second light emitting devices. The light emitting device may include an LED chip bond to directly to a PCB board as in the chip-on-board technology or a surface mount LED package having an encapsulated LED chip, as well as one or more of an optical lens, bonding wires, electrodes, etc.

Each first light emitting device has an LED chip/package electrically connected to the substrate and a piece of first circular polarizer attached to the surface of the LED chip/package. Likewise, each second light emitting device includes an LED chip/package electrically connected to the substrate and a piece of second circular polarizer attached to the surface of the LED chip/package. The first circular polarizer and the second circular polarizer are of opposite circular polarizations.

In some embodiments of the current disclosure, the array of light emitting devices comprises rows of the first light emitting devices interlaced with rows of the second light emitting devices. In one of such patterns, except for the rows on the edge of the array, one row of the first light emitting devices is disposed between two rows of second light emitting devices, and vice versa.

In other embodiments, the plurality of first light emitting devices interlaced with the plurality of the second light emitting devices in a checkerboard pattern. In a specific checkerboard pattern, in the center portion of the array, one first light emitting device may have four edges and each edge borders a second light emitting device. Conversely, a second light emitting device may have four edges and each edge boards a first light emitting device.

In further embodiments, a layer of black resin is disposed in and fills the gap between adjacent light emitting devices. In still other embodiments, a top surface of the black resin layer is level with or lower than a top surface of the LED chip/package in the first or the second light emitting device. In a further aspect of the disclosure, the top surface of the black resin layer is level with or lower than a top surface of the first circular polarizer in the light emitting device.

In still further embodiments, a layer of transparent resin disposed on top of the black resin layer. The transparent resin can be an epoxy resin or a silicon resin.

The substrate may be a printed circuit board (PCB) and the light emitting devices are connected to conductive elements on the PCB. The black resin may contain a black pigment and an epoxy resin or a silicon resin.

The disclosure also provides a method to manufacture an LED display panel. The method includes the steps of cutting a film of first circular polarizer to obtain a plurality of first circular polarizer units; cutting a film of second circular polarizer to obtain a plurality of second circular polarizer units; attaching each of the plurality of first circular polarizer units to a first plurality of LED chips/packages to form a plurality of first light emitting devices; attaching each of the plurality of second circular polarizer units to a second plurality of LED chips/packages to form a plurality of second light emitting devices. The first circular polarizer and the second circular polarizer are of opposite circular polarizations.

The first plurality of LED chips/packages and the second plurality of LED chips/packages are mounted on the substrate in a strip-by-strip pattern or a checkerboard pattern.

The method may also include a step of applying a layer of black resin in the gap between two adjacent LED chips/ packages. The method may further include a step of applying a layer of black resin between adjacent light emitting devices.

Other features and aspects will be apparent from the following detailed description, the drawings, and the claims.

Figure 1:
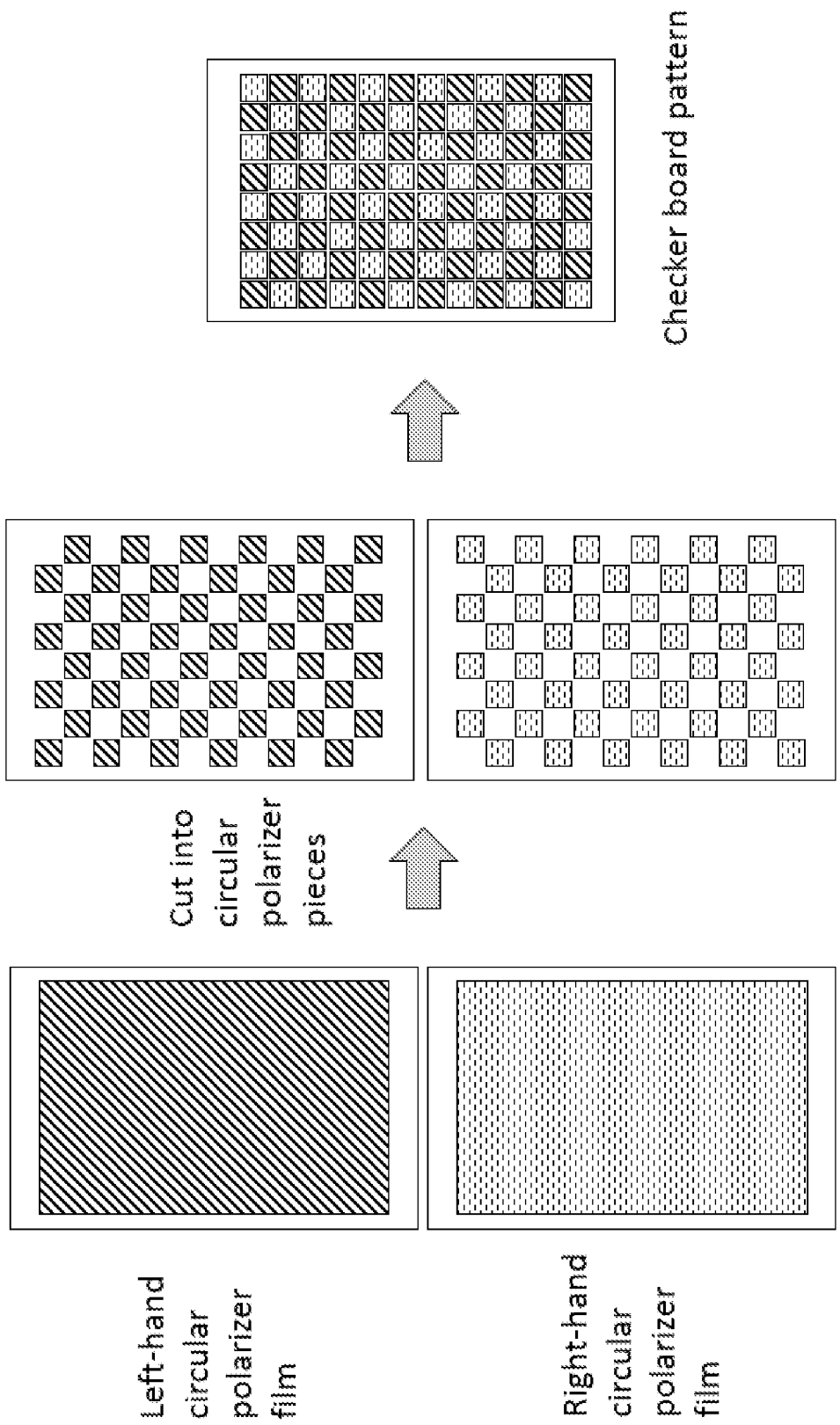
FIG. 1 is a schematic diagram illustrating a checkerboard patterned circular polarizer assembly.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the systems, apparatuses, and/or methods described herein will be apparent to one of ordinary skill in the art. For example, used herein, the word "film" describes a thin, flat sheet of material, which can be either flexible or rigid. Further, used herein, the term "LED chip/package" refers to any LED device known in LED packaging technologies, which include a bare LED chip attached to a PCB board as in the chip-on-board technology, a surface mount LED package having an encapsulated LED chip and any design variations thereof. The term "LED chips/packages" is the plural form of "LED chip/package." A light emitting device, used herein, may include an LED chip/package as well as a circular polarizer attached thereto.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Figure 2:
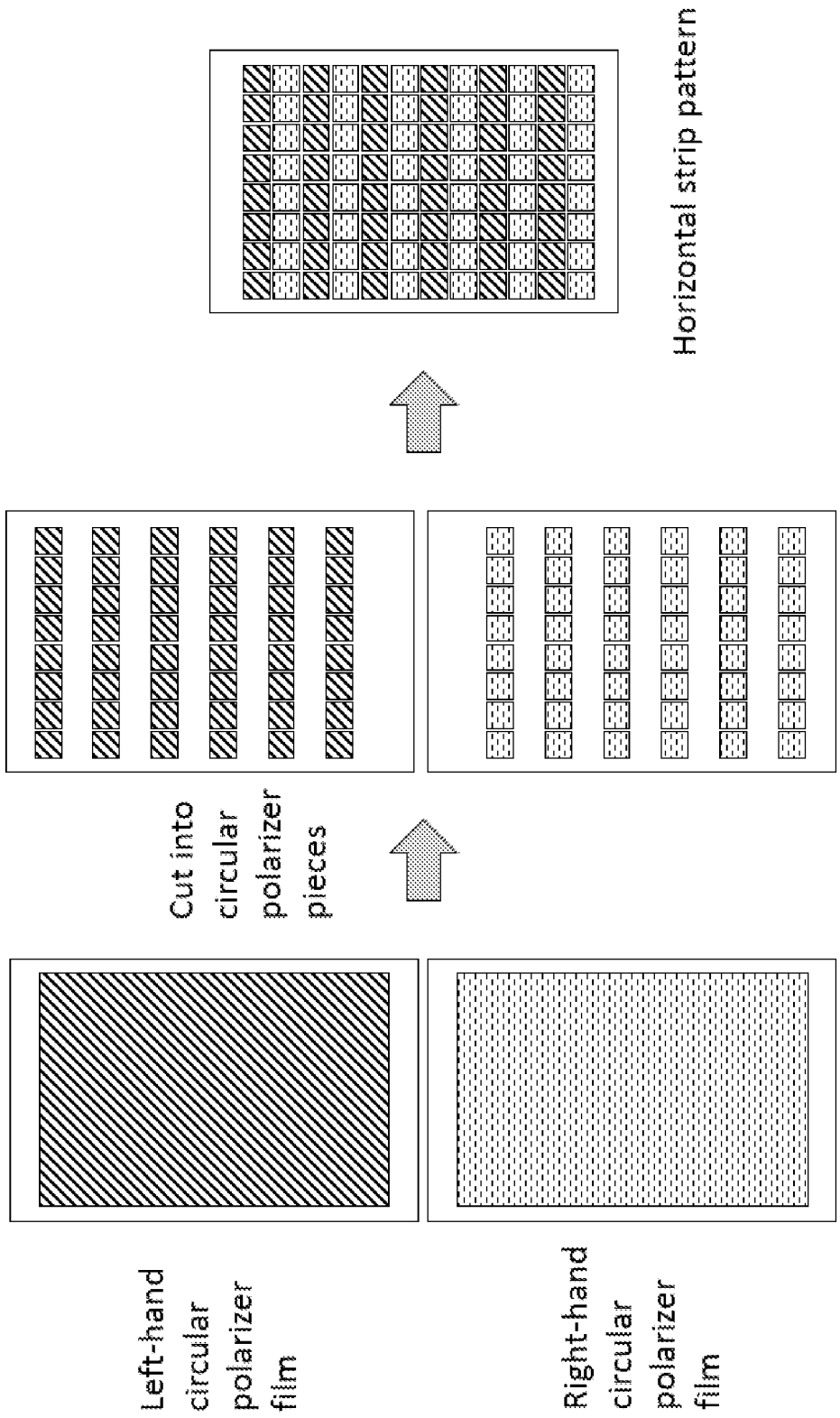
FIG. 2 is a schematic diagram illustrating a strip-by-strip patterned circular polarizer assembly.

FIG. 1 illustrates the arrangement of a checkerboard patterned circular polarizer. Two opposite circular polarizer film are cut into small, individual pieces and assembled into an interlaced, checkerboard pattern. The circular polarizer film may be of 100 mm by 50 mm in size and is commercially available. FIG. 2 shows that the individual polarizer pieces are assembled into an interlaced, strip-by-strip pattern. The circular polarizer film can be cut using any suitable methods, including die cutting, laser cutting, etc. The piece of circular polarizer cut from the film may have a dimension in the range of 0.5 mm to 4.0 mm, for example, 1.0 mm to 2.2 mm, or 1.6 mm to 2.0 mm.

Figure 3:
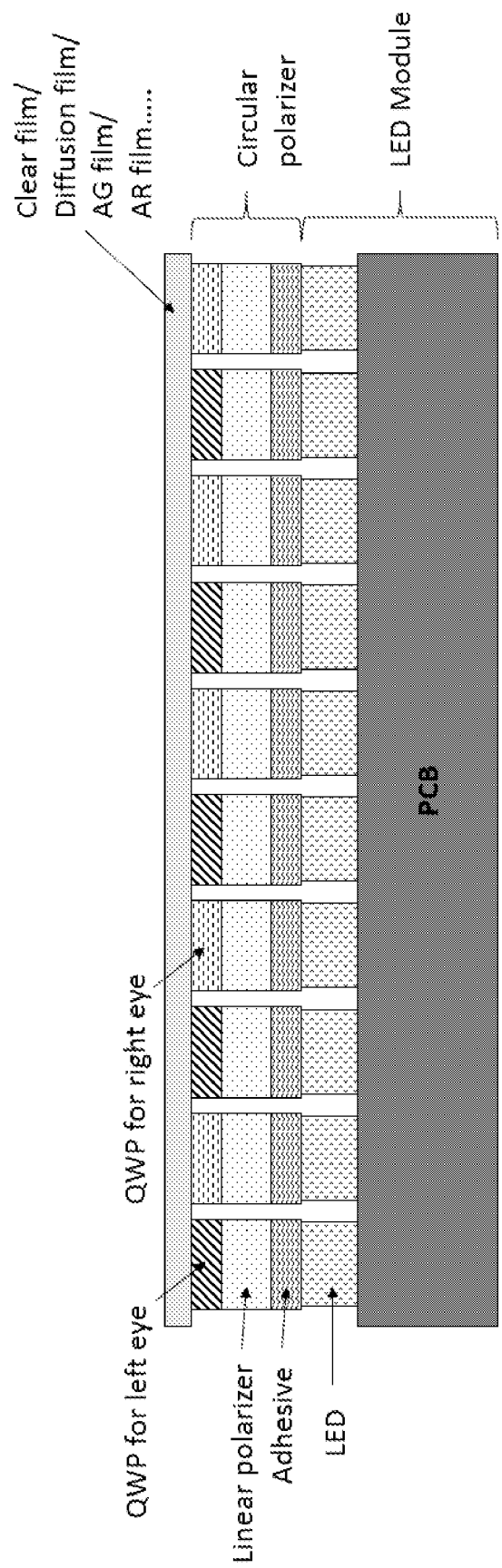
FIG. 3 illustrates the layered structure in a 3D LED display panel according to an embodiment in this disclosure.

As shown in FIG. 3, the circular polarizer pieces are attached to an array of light emitting devices mounted on a printed circuit board (PCB). In this embodiment, each of the circular polarizer pieces is aligned with and adhered to one individual LED chip/package using an adhesive, forming an light emitting devices. The size of the circular polarizer piece is usually equal or larger than the size of the LED chip/package. For example, the LED chip/package may be 1.0 mm in size while the size of the circular polarizer piece is 1.0 or 1.9 mm for the pitch 1.9 mm LED display panel.

In the embodiment of FIG. 3, a film is applied on top of the array of light emitting devices. The film can be any suitable film or sheet that is known in the art, e.g., an anti-glare, an anti-reflective film, a clear film, a diffuser film.

Figure 4A:
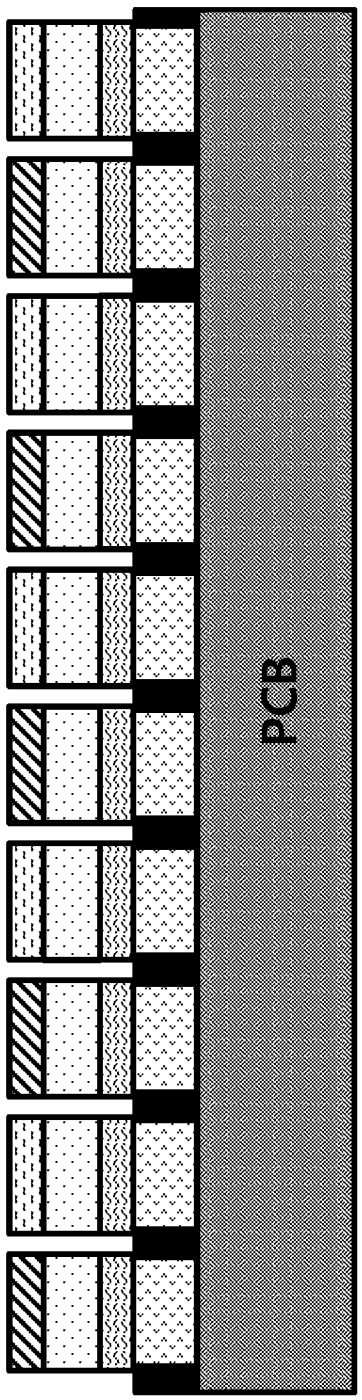
FIG. 4A shows a first embodiment of the current disclosure.
Figure 4B:
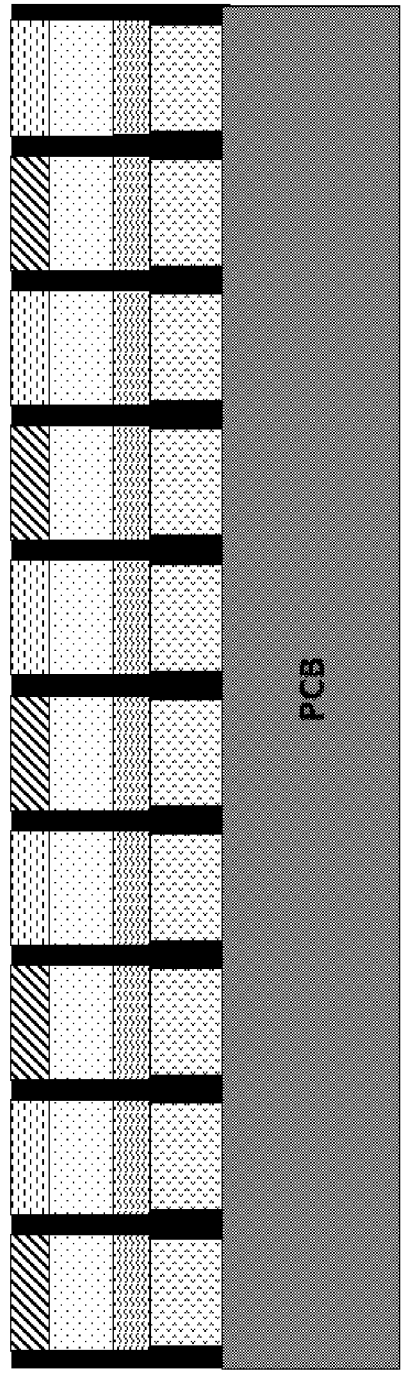
FIG. 4B shows a second embodiment of the current disclosure.

FIG. 4A and FIG. 4B show further embodiments of the current disclosure. In the embodiment of FIG. 4A, the black molding material is level with the surface of the LED chip/package. Alternatively, in FIG. 4B, the black resin molding material rises to be level with the top surface of the circular polarizer pieces such that each individual light emitting device is disposed in a "well" of black resin. In one aspect of the embodiment in FIG. 4A, the LED array may be first molded with the black resin before the circular polarizer pieces are applied. In another aspect of the embodiment shown in FIG. 4B, the circular polarizer pieces are first applied to the LED chips/packages so that the light emitting device are formed before they are molded with the black resin. Application of black resin in both embodiments increases the contrast ratio of the display and reduce optical crosstalk amongst various LED chips/packages.

Figure 5A:
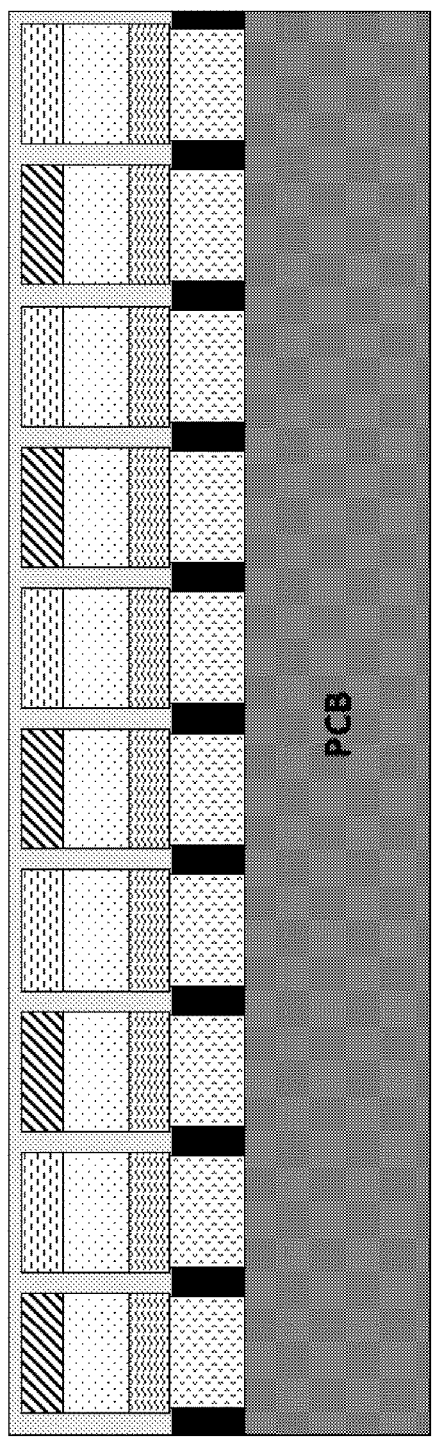
FIG. 5A shows a third embodiment of the current disclosure.
Figure 5B:
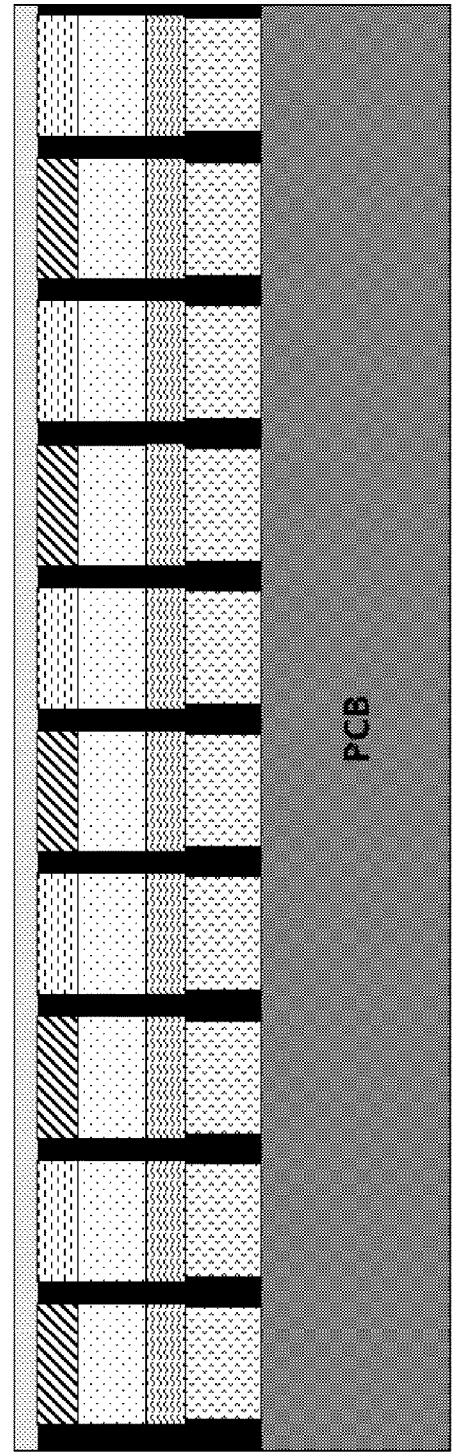
FIG. 5B shows a further embodiment of the current disclosure.

FIG. 5A shows a variant of the embodiment in FIG. 4A in that the portion of circular polarizer in the light emitting device is molded with a clear resin for protection. FIG. 5B is a variant of the embodiment in FIG. 4B in that a clear film is applied over the surface of the light emitting device.

In other embodiments of the current disclosure, the size of the circular polarizer can be adjusted according to several factors, including the size of the LED chip/package the polarizer is attached to, the desired viewing angle, etc. For example, a wider viewing angle may require the LED chip/package be covered by a larger circular polarizer piece, and vice versa.

In still other embodiments, the 3D LED display is connected to a controller and a driver. The controller may operate in a 2D mode or in a 3D mode. In the 2D mode, the driver latches video data of 2D data format under control of the controller and converts the video data into the R, G, B voltages of 2D format and supply them to all pixels in the LED display. In the 3D mode, the driver latches video data of 3D data format under control of the controller and converts the video data into the R, G, B voltages of 3D format. The data voltage of 3D data format is applied to pixels in an interlaced fashion, e.g., in a checkerboard pattern or in a strip-by-strip pattern.

Therefore, the scope of the disclosure is defined not by the detailed description, but by the claims and their equivalents, and all variations within the scope of the claims and their equivalents are to be construed as being included in the disclosure.

What is claimed is:

1. A method to manufacture an LED display panel, comprising:
   cutting a film of first circular polarizer to obtain a plurality of first circular polarizer units;
   cutting a film of second circular polarizer to obtain a plurality of second circular polarizer units, wherein the first circular polarizer and the second circular polarizer are of opposite circular polarizations;

attaching each of the plurality of first circular polarizer units to each of a first plurality of LED chips/packages to form a plurality of first light emitting devices so that each first light emitting device has a first circular polarizer unit attached thereto;

attaching each of the plurality of second circular polarizer units to each of a second plurality of LED chips/packages to form a plurality of second light emitting devices so that each second light emitting device has a second circular polarizer unit attached thereto, wherein the plurality of first light emitting devices and the plurality of second light emitting devices are disposed on a substrate.

2. The method of claim 1, comprising mounting the first plurality of LED chips/packages and the second plurality of LED chips/packages on the substrate.

3. The method of claim 1, comprising mounting the plurality of first light emitting devices and the plurality of second light emitting devices on the substrate to form an array of light emitting devices.

4. The method of claim 1, wherein the plurality of first light emitting devices and the plurality of second light emitting devices are interlaced on the substrate in a checkerboard pattern or in a strip-by-strip pattern.

5. The method of claim 2, further comprising applying a layer of black resin between adjacent LED chips/packages, wherein a top surface of the black resin layer is level with or lower than a top surface of each LED chip/package in the first or the second light emitting device.

6. The method of claim 3, further comprising applying a layer of black resin between adjacent light emitting devices, wherein a top surface of the black resin layer is level with or lower than a top surface of each LED chip/package in the first or the second light emitting device.

7. The method of claim 3, further comprising applying a layer of transparent resin over the array of light emitting devices.

\* \* \* \* \*